United States Patent
Lee et al.

(10) Patent No.: US 8,822,299 B2
(45) Date of Patent: Sep. 2, 2014

(54) METHOD OF FABRICATING SEMICONDUCTOR DEVICE

(75) Inventors: Kwangwook Lee, Seongnam-si (KR); Inseak Hwang, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 522 days.

(21) Appl. No.: 13/038,663

(22) Filed: Mar. 2, 2011

(65) Prior Publication Data
US 2011/0215421 A1 Sep. 8, 2011

(30) Foreign Application Priority Data
Mar. 3, 2010 (KR) .................. 10-2010-0019119

(51) Int. Cl.
*H01L 21/336* (2006.01)

(52) U.S. Cl.
USPC ........... 438/305; 438/586; 438/595; 438/695; 438/738; 438/756; 257/E21.626

(58) Field of Classification Search
USPC ......... 438/305, 586, 592, 595, 695, 719, 721, 438/738, 756; 257/E21.618, E21.626
See application file for complete search history.

(56) References Cited

U.S. PATENT DOCUMENTS

| | | | | |
|---|---|---|---|---|
| 5,368,686 A | * | 11/1994 | Tatsumi et al. | 438/696 |
| 6,261,934 B1 | | 7/2001 | Kraft et al. | |
| 6,271,564 B1 | * | 8/2001 | Morihara et al. | 257/344 |
| 7,029,999 B2 | * | 4/2006 | Lim et al. | 438/585 |
| 7,785,919 B2 | * | 8/2010 | Park | 438/70 |
| 2007/0004156 A1 | * | 1/2007 | Rouse et al. | 438/299 |
| 2007/0048987 A1 | * | 3/2007 | Satonaka | 438/585 |

FOREIGN PATENT DOCUMENTS

| | | |
|---|---|---|
| KR | 20040057380 A | 7/2004 |
| KR | 20050000208 A | 1/2005 |
| KR | 20080002548 A | 1/2008 |

* cited by examiner

*Primary Examiner* — Mary Wilczewski
*Assistant Examiner* — Toniae Thomas
(74) *Attorney, Agent, or Firm* — Volentine & Whitt, PLLC

(57) ABSTRACT

A method of fabricating a semiconductor device includes forming a gate dielectric layer comprising an oxide, and at least one conductive layer on a substrate, forming a mask on the conductive layer and patterning the at least one conductive layer by etching the at least one conductive layer using the mask as an etch mask to thereby form a gate electrode, wherein the oxide of the gate dielectric layer and the material of the at least one conductive layer are selected such that a byproduct of the etching of the at least one conductive layer, formed on the mask during the etching of the at least one conductive layer, comprises an oxide having a higher etch rate with respect to an etchant than the oxide of the gate dielectric layer.

15 Claims, 21 Drawing Sheets

METHOD OF FABRICATING SEMICONDUCTOR DEVICE

PRIORITY STATEMENT

This U.S. non-provisional patent application claims priority under 35 U.S.C. §119 to Korean Patent Application No. 10-2010-0019119, filed on Mar. 3, 2010.

BACKGROUND

1. Technical Field

The inventive concept relates to methods of fabricating semiconductor devices. More particularly, the inventive concept relates to a semiconductor device including a gate electrode and to a method of fabricating the same.

2. Description of Related Art

The fabricating of semiconductor devices entails forming various patterns using a mask. An example of such a patterning process is the etching of a silicon-containing conductive layer to form a conductive pattern such as a pattern of gate electrodes. The patterning process is followed by a deposition process in which an interlayer dielectric is deposited to fill the space between the gate electrodes. However, when the silicon-containing conductive layer is etched, byproducts of the etching process are produced on the mask. A void or a seam may be formed in the interlayer dielectric due to the etch byproducts. The void or the seam can degrade the electrical characteristics of the semiconductor device.

SUMMARY

According to another aspect of the inventive concept, there is provided a method of fabricating a semiconductor device in which at least one conductive layer is formed on a gate dielectric layer, a mask is formed on the conductive layer(s), and the conductive layer(s) is/are patterned by etching the conductive layer(s) using the mask as an etch mask to thereby form the gate electrode but wherein an oxide byproduct of the etch process may accumulate on the mask. The oxide of the gate dielectric layer and the material of the at least one conductive layer are selected, though, such that the byproduct of the etch process will have an etch selectivity and, in particular, a higher etch rate with respect to a specified etchant, than the oxide of the gate dielectric layer.

According to another aspect of the inventive concept, there is provided a method of fabricating a semiconductor device in which a gate dielectric layer comprising an oxide is formed on a substrate, a first conductive layer comprising silicon is formed on the gate dielectric layer, a second conductive layer comprising a metal or a metal compound is formed on the first conductive layer, a mask is formed on the second conductive layer, an anisotropic etch process is performed on the conductive layers using the mask as an etch mask to thereby form spaced apart gate electrodes each having a segment of the mask thereon, an etch process is subsequently performed to remove a byproduct of the anisotropic etch process from the mask, a source/drain region is formed adjacent opposite sides of the gate electrodes, interlayer dielectric is subsequently deposited on the substrate to such a thickness as to fill openings between the gate electrodes, a contact hole is formed in the interlayer dielectric to expose the source/drain region, and a contact plug is formed in the contact hole.

DETAILED DESCRIPTION OF THE PREFERRED EMBODIMENTS

Figure 1A:
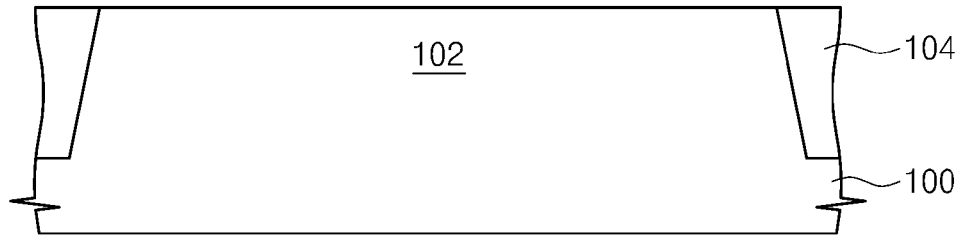
FIGS. 1A to 1O are cross-sectional views illustrating an embodiment of a method of fabricating a semiconductor device according to the inventive concept.

Various embodiments and examples of embodiments of the inventive concept will be described more fully hereinafter with reference to the accompanying drawings. In the drawings, the sizes and relative sizes and shapes of elements, layers and regions, such as implanted regions, shown in section may be exaggerated for clarity. In particular, the cross-sectional illustrations of the semiconductor devices and intermediate structures fabricated during the course of their manufacture are schematic. Also, when like numerals appear in the drawings, such numerals are used to designate like elements.

Furthermore, spatially relative terms are used to describe an element's and/or feature's relationship to another element(s) and/or feature(s) as illustrated in the figures. Thus, the spatially relative terms may apply to orientations in use which differ from the orientation depicted in the figures. Obviously, though, all such spatially relative terms refer to the orientation shown in the drawings for ease of description and are not necessarily limiting as embodiments according to the inventive concept can assume orientations different than those illustrated in the drawings when in use.

It will also be understood that when an element or layer is referred to as being "on" or "over" or "connected to" another element or layer, it can be directly on or over or directly connected to the other element or layer or intervening elements or layers may be present. In contrast, when an element or layer is referred to as being "directly" on or over or "directly" connected to another element or layer, there are no intervening elements or layers present.

Other terminology used herein for the purpose of describing particular examples or embodiments of the inventive concept is to be taken in context. For example, the terms "comprises" or "comprising" when used in this specification specifies the presence of stated features or processes but does not preclude the presence or additional features or processes.

Examples of a method of fabricating a semiconductor device according to the inventive concept will now be described with reference to FIGS. 1A to 1O.

Referring first to FIG. 1A, a field area 104 may be formed in a substrate 100 to define an active area 102. For example, the field area 104 may be formed by a shallow trench isolation (STI) process. More specifically, the field area 104 may be formed by forming a trench in the substrate 100 and depositing an oxide, nitride or oxynitride (e.g., silicon oxide, silicon nitride or silicon oxynitride, respectively) in the trench. The active area 102 delimited by the field area 104 may have a linear form, as an example, i.e., may be elongated in a first direction.

The substrate 100 may be a silicon (Si) substrate, a silicon-germanium (Si—Ge) substrate, a silicon-on-insulator (SOI) substrate, a germanium-on-insulator (GOI) substrate, or a silicon-germanium-on-insulator (SGOI) substrate. Furthermore, the substrate 100 may be doped with (first) impurities of a predetermined (first) conductivity type. For example, in this embodiment of the inventive concept, the substrate 100 is doped with P-type impurities. The P-type impurities may be boron (B), gallium (Ga), or indium (In).

Figure 1B:
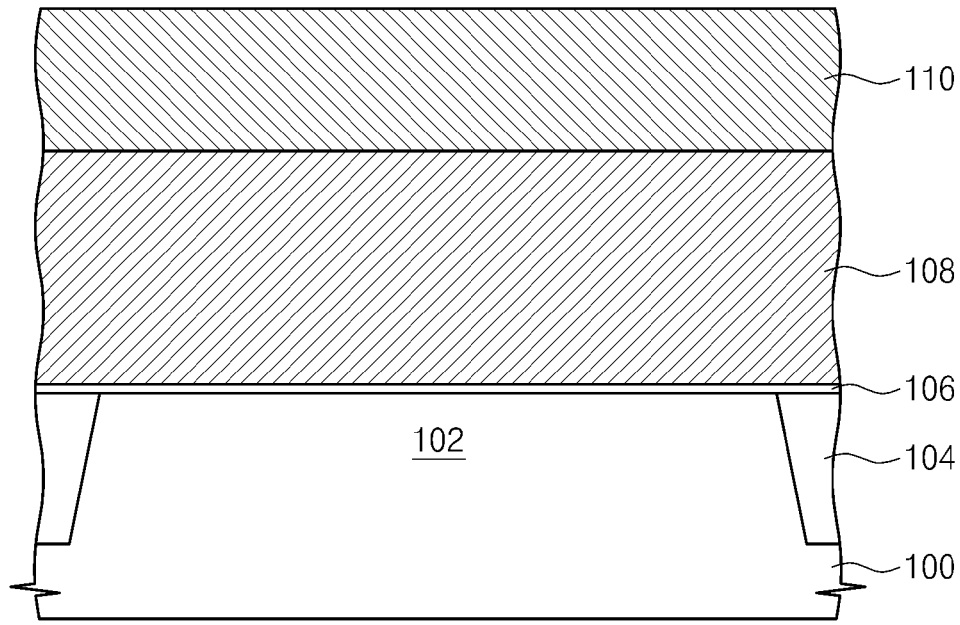

Referring to FIG. 1B, a gate dielectric layer 106, a first conductive layer 108, and a second conductive layer 110 may be formed on the substrate 100. According to an embodiment of the inventive concept, the gate dielectric layer 106 may comprise silicon oxide. In this case, the gate dielectric layer 106 may be formed by a chemical vapor deposition (hereinafter referred to as "CVD") process, an atomic layer deposition (hereinafter referred to as "ALD") process or a thermal oxidation process.

According to another embodiment of the inventive concept, the gate dielectric layer 106 may comprise a metal oxide layer. Examples of the metal oxide include tantalum oxide, titanium oxide, hafnium oxide, zirconium oxide, aluminum oxide, niobium oxide, cesium oxide, yttrium oxide, indium oxide and iridium oxide. Furthermore, the gate dielectric layer 106 may be a laminate. In this case, the gate dielectric layer 106 may be formed by a CVD process, an ALD process or a metal organic CVD (MOCVD) process.

The first conductive layer 108 may be formed on the gate dielectric layer 106. The first conductive layer 108 contains silicon. For example, the first conductive layer 108 may be a layer of polysilicon doped with (second) impurities of a conductivity type different from that of the active area 102, i.e., the first conductive layer 108 may be a layer of polysilicon doped with impurities of a second conductivity type. The second impurities thus may be N-type impurities such as phosphorous (P) or arsenic (As).

The second conductive layer 110 may be formed on the first conductive layer 108. The second conductive layer 110 may comprise a metal, i.e., consists of a metal or a metal compound. For example, the second conductive layer 110 may comprise tungsten (W), tantalum (Ta), titanium (Ti), copper (Cu), titanium nitride (TiN), cobalt nitride (CoN) or a combination thereof.

The second conductive layer 110 may be formed by a physical vapor deposition (PVD) process such as a sputtering process. Therefore, the second conductive layer 110 may prevent a defect, such as whisker growth, at a metal layer during a subsequent (ashing or annealing) process. This will be described more fully later on with reference to Experiment Examples 1.

Figure 1C:
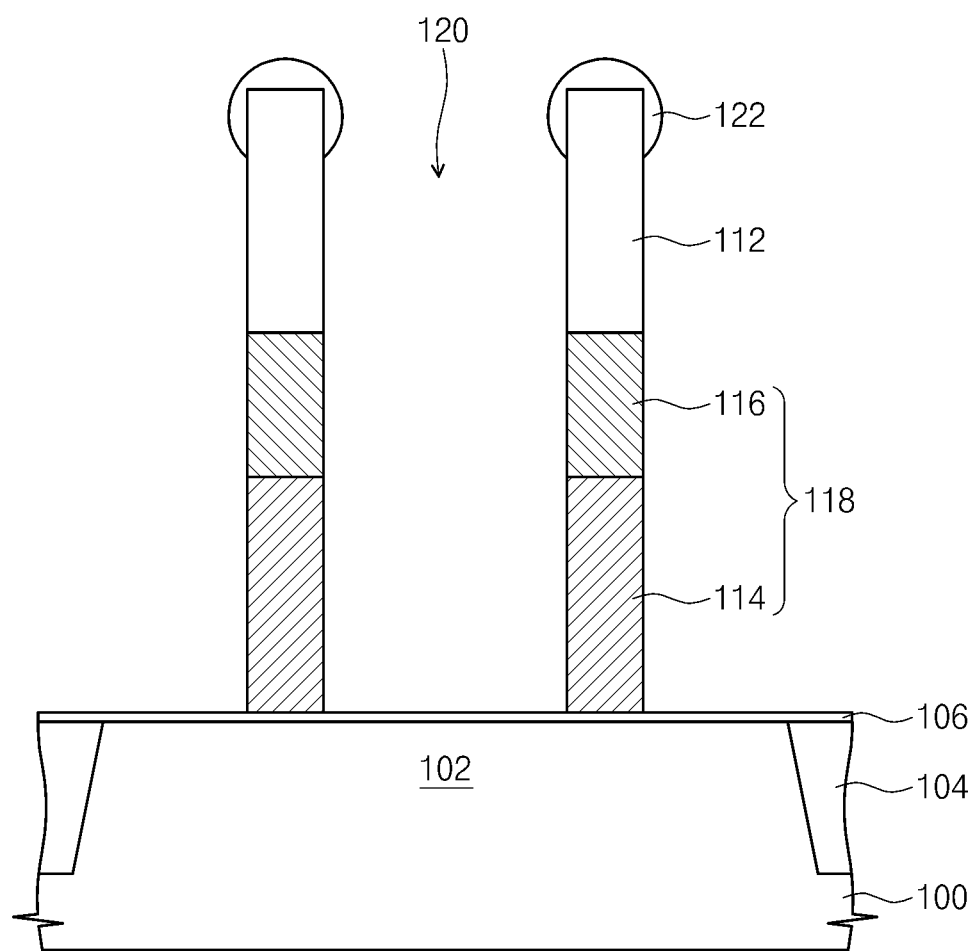

Referring to FIG. 1C, a gate electrode 118 may be formed on the gate dielectric layer 106.

More specifically, a mask 112 may be formed on the second conductive layer (110 in FIG. 1B). The mask 112 may comprise a nitride, e.g., silicon nitride. The first and second conductive layers (108 and 110 in FIG. 1B) are patterned by an anisotropic etch process using the mask 112. Preferably, the process of etching the first and second conductive layers 108 and 110 may be a plasma etch process.

As a result of the anisotropic etch process, gate electrodes 118 including a first conductive pattern 114 and a second conductive pattern 116 are formed on the gate dielectric layer 106. Each gate electrode 118 may extend in a second direction which is substantially different from the first direction. In addition, an opening 120 may be formed between gate electrodes 118.

An etch byproduct 122 may be produced on the mask 112 during the plasma etch process. In particular, the etch byproduct 122 may be produced during the etching of the first conductive layer 108 and thus, may comprise silicon oxide. As a result, a projection may be formed on an upper portion of the mask 112. If left unattended, the upper portion of mask 112 could cause a void or a seam to be formed in an interlayer dielectric deposited to fill the opening 120.

Figure 1D:
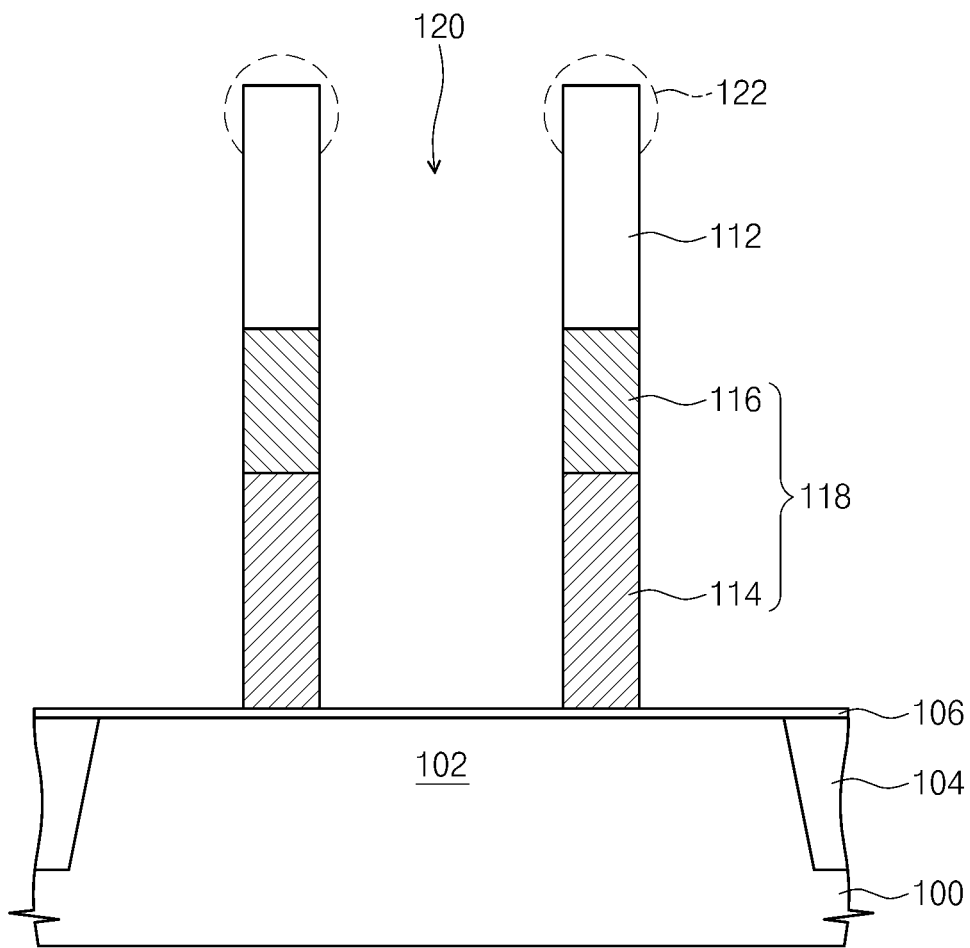

Referring to FIG. 1D, the etch byproduct 122 may be removed from the mask 112. In this embodiment of the inventive concept, the etch byproduct 122 may be removed from the mask 112 by an isotropic etch process.

In examples of the inventive concept in which the gate dielectric layer may comprise silicon oxide and the etch byproduct 122 may be formed as the result of the plasma etching of doped polysilicon constituting the first conductive layer 108, the etch byproduct 122 may be removed by an isotropic etch process that etches the byproduct 122 at a rate that is about five times higher than that of the gate dielectric layer 106. To this end, the etchant employed in the isotropic etch process may comprise diluted hydrofluoric acid (HF), diluted ammonium fluoride ($NH_4F$) or a combination thereof.

In any case, the gate dielectric layer 106 may be not be substantially etched during the removal of the etch byproduct 122. Accordingly, a DRAM including a transistor comprising gate electrode 118 will have optimal refresh operation characteristics. This will be described more fully later on with reference to Experimental Examples 2.

Furthermore, as alluded to above, a dielectric layer filling the opening 120 will be free of voids or a seam. This will be described more fully later on with reference to Experimental Examples 5.

Figure 1E:
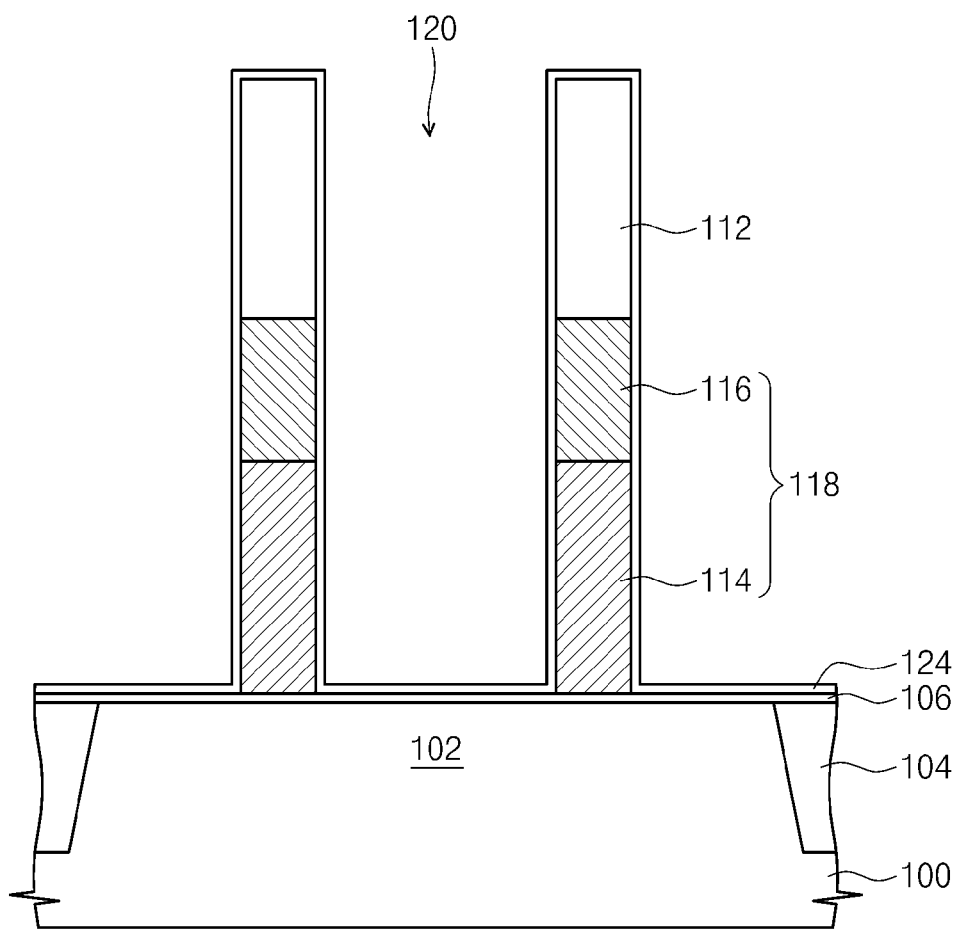

Referring to FIG. 1E, a first capping layer 124 may be then conformally formed on the substrate 100, thereby covering the mask 112 and the gate electrode 118. The capping layer 124 thus does not fill the opening 120.

The first capping layer 124 may comprise an oxide, e.g., silicon oxide. Preferably, the first capping layer 124 may be formed by an ALD process because an oxide layer formed by an ALD process may be clearer than an oxide layer formed by a thermal oxidation process or a CVD process.

Figure 1F:
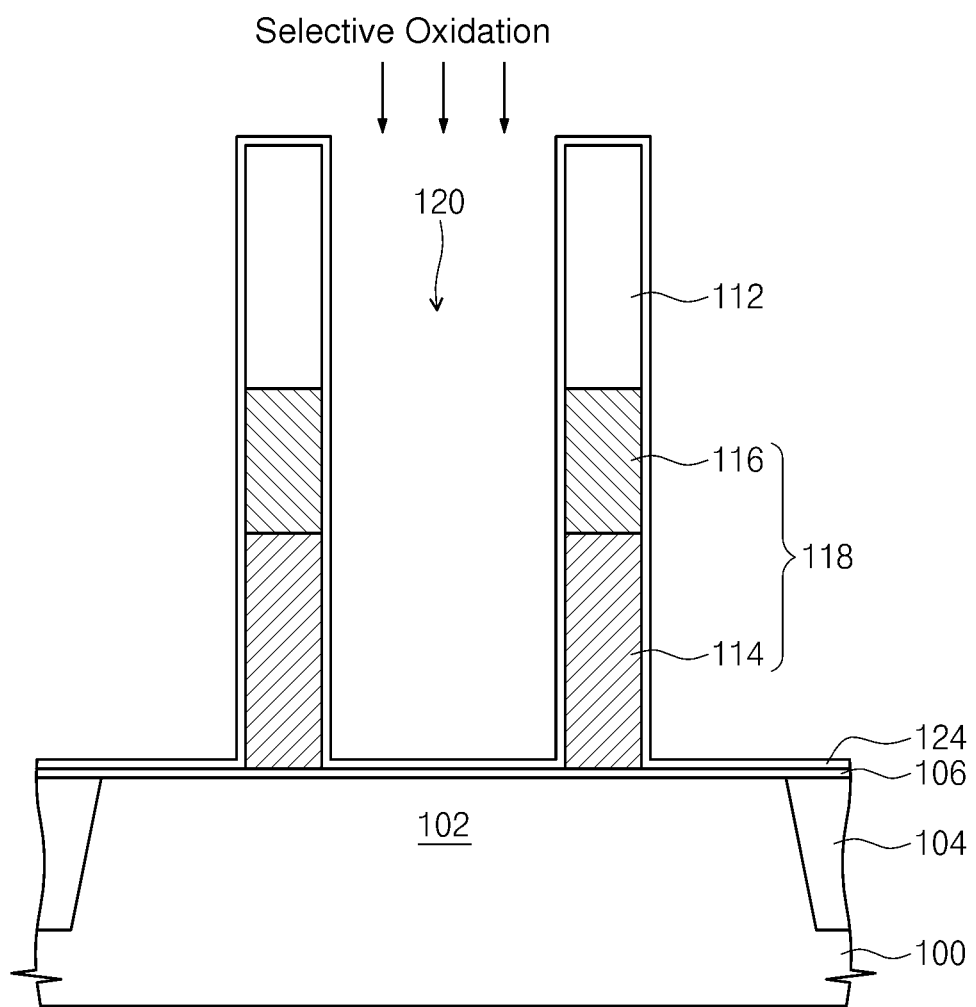

Referring to FIG. 1F, a selective oxidation process may be then optionally performed.

The selective oxidation process may be performed to cure the first conductive pattern 114 of plasma damage incurred when the first and second conductive layers (108 and 110 in FIG. 1B) are anisotropically etched. As a result, the selective oxidation process may cause the first conductive pattern 114 to become substantially wider than the second conductive pattern 116 or the mask 112.

Figure 1G:
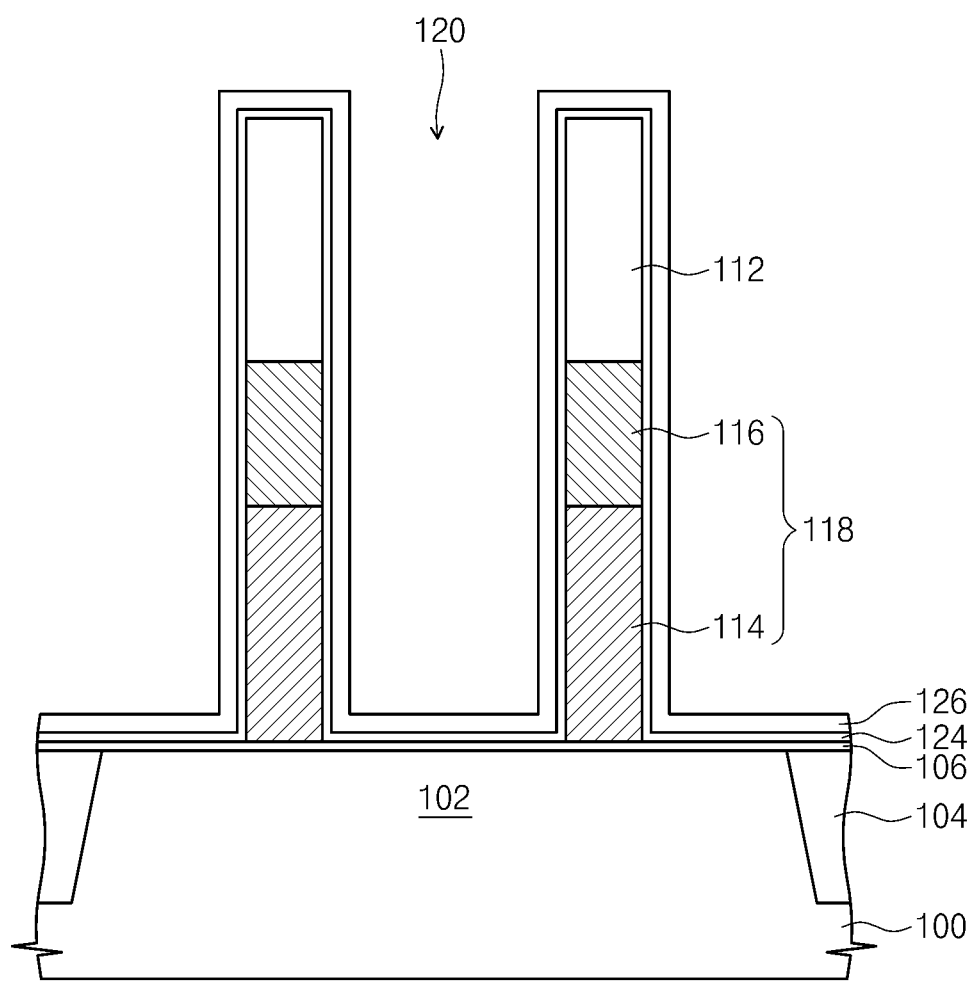

Referring to FIG. 1G, a second capping layer 126 may be then conformally formed on the substrate 100, thereby covering first capping layer 124. Thus, the second capping layer 126 does not fill what remains of the opening 120.

The second capping layer 126 may comprise a nitride, e.g., silicon nitride. Preferably, the second capping layer 126 may be formed by an ALD process because a nitride layer formed by the ALD process is clearer than a nitride layer formed by a CVD process.

Figure 1H:
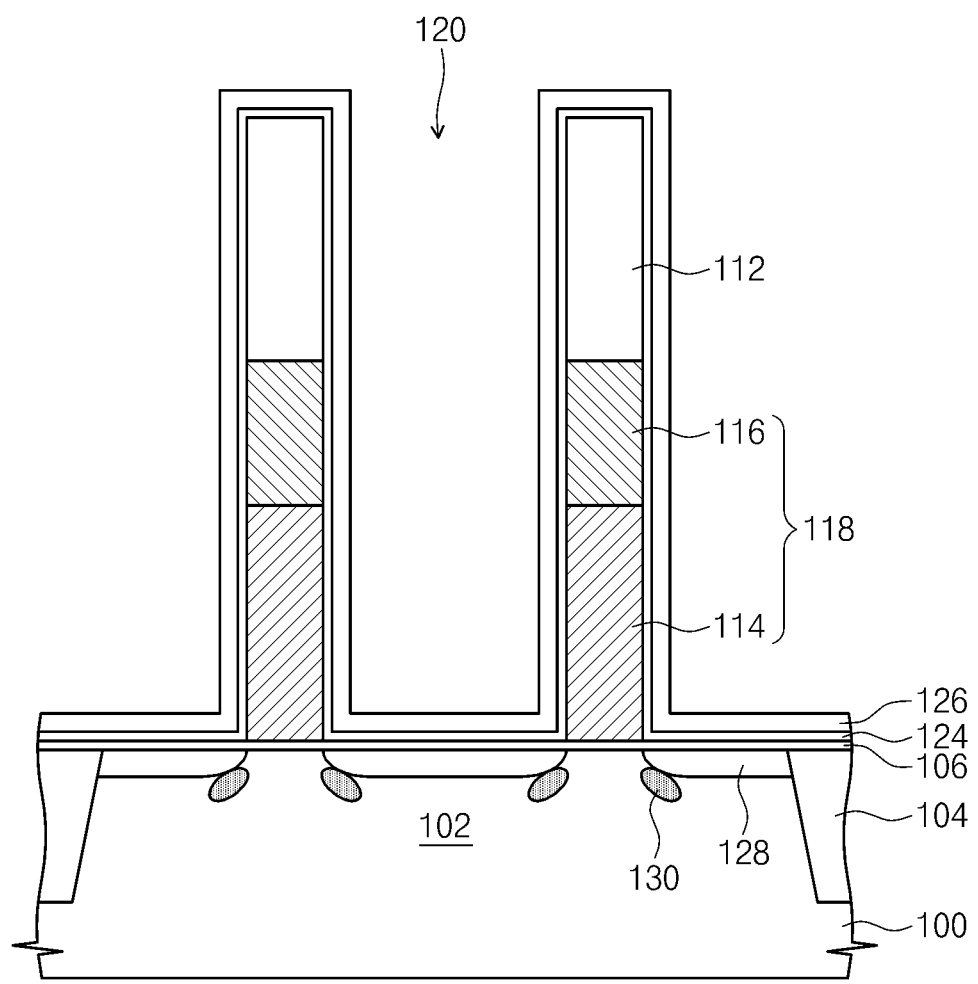

Referring to FIG. 1H, a first impurity region 128 and a halo region 130 may be formed on the substrate 100 adjacent to opposite sides of the gate electrode 118.

More specifically, (third) impurities of the second conductivity type may be implanted into the substrate 100 to form the first impurity region 128 adjacent opposite sides of the gate electrode 118, i.e., such that boundary of the first impurity region 128 is substantially vertically aligned with the sides of the gate electrode 118. For example, in the case in which the substrate 100 contains P-type impurities, the third impurities may be N-type impurities. In this process, the third impurities diffuse into the substrate 100 below the first and second capping layers 124 and 126.

An ion implantation mask (not shown) may then be formed to cover a central portion of the first impurity region 128. Then (fourth) impurities of the first conductivity type are implanted to form halo region 130 beneath sides of the first impurity region 128. For example, in the case in which the first impurities are N-type impurities, the fourth impurities may be P-type impurities. The ion implantation mask may then be removed.

Figure 1I:
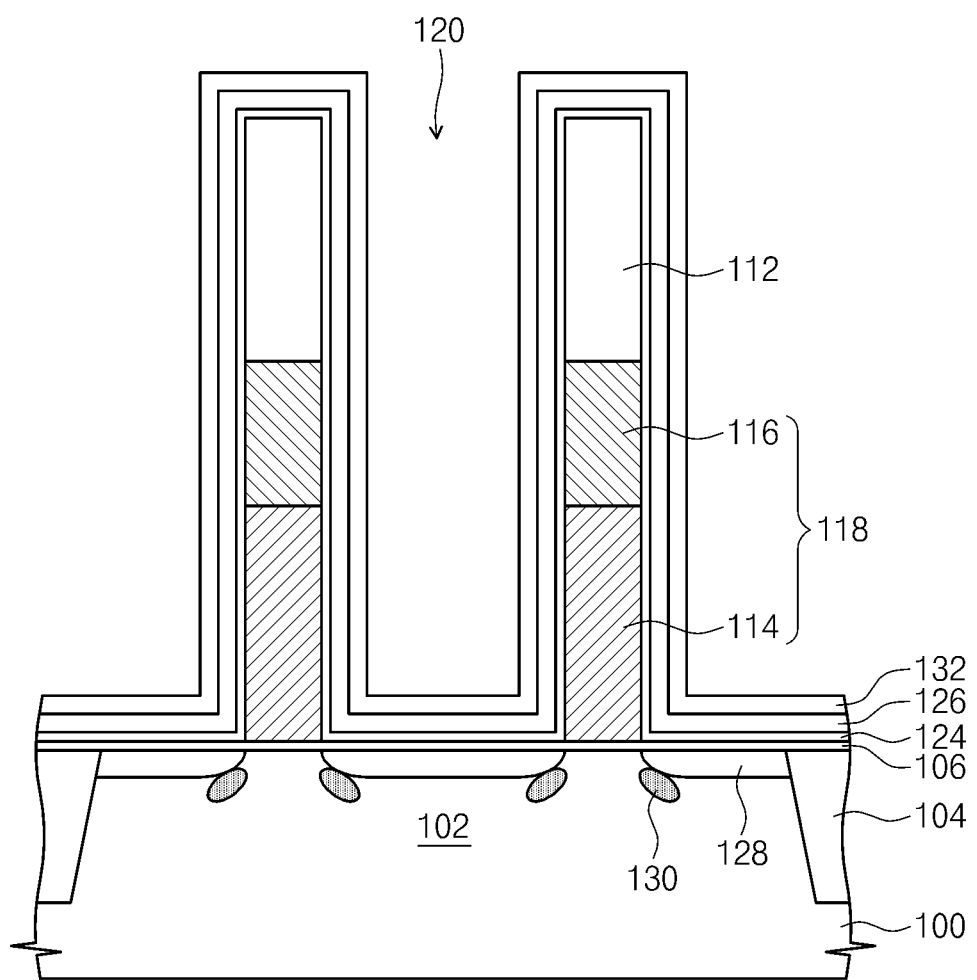

Referring to FIG. 1I, a spacer layer 132 may be conformally formed on the second capping layer 126. Thus, the spacer layer 132 does not fill what remains of the opening 120.

The spacer layer 132 may comprise a nitride, e.g., silicon nitride. In addition, the spacer layer 132 may be formed by a CVD process or an ALD process.

Figure 1J:
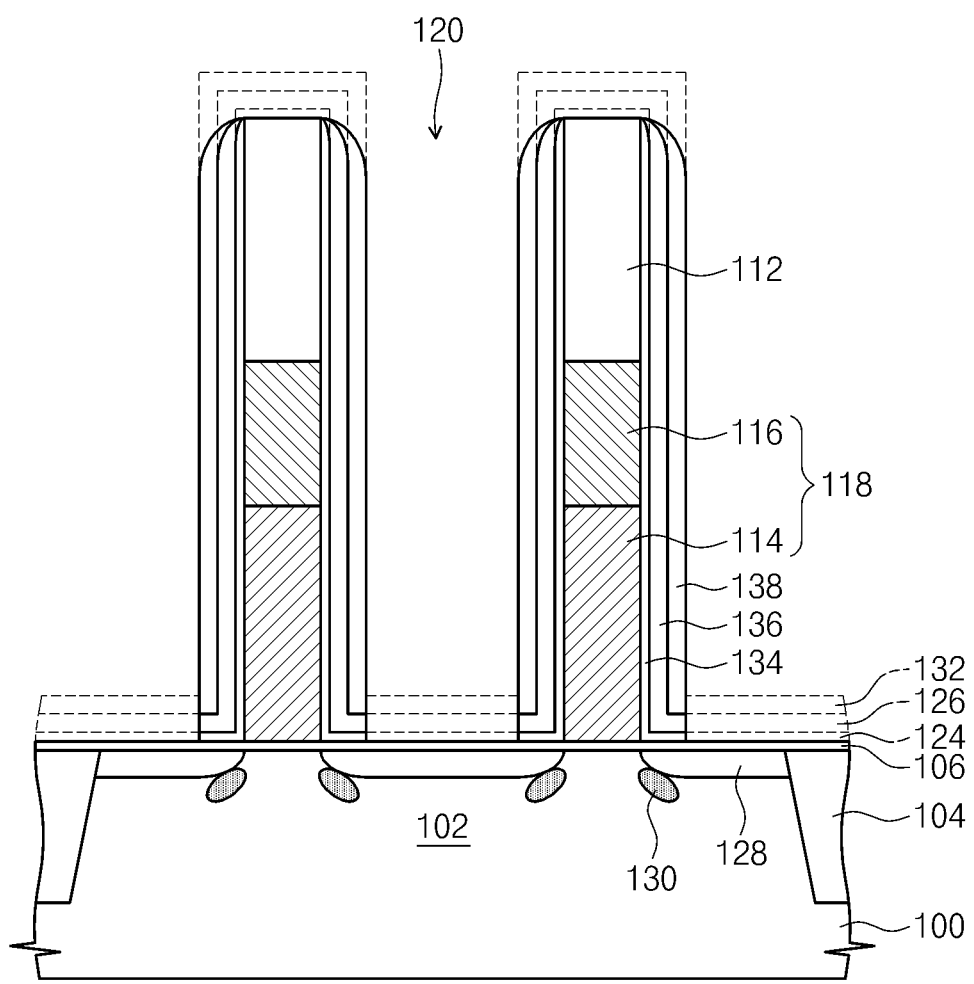

Referring to FIG. 1J, the spacer layer 132 and the first and second capping layers 124 and 126 are etched to form a first capping pattern 134, a second capping pattern 136, and a spacer 138 on sidewalls of the gate electrode 118 and the mask 112. In an example of this embodiment of the inventive concept, the first and second capping layers 124 and 126 are etched by an anisotropic etch process. In this process, those collective portions of the spacer layer 132 and the first and second capping layers 124 and 126 which lie directly over the mask 112 and the substrate 100 are removed, while those portions of the spacer layer 132 and the first and second capping layers 124 and 126 which extend along the sidewall surfaces of the gate electrode 118 are basically not removed. Thus, first and second capping patterns 134, 136 and a spacer 138 are formed on the sidewall surfaces of the gate electrode 118 and the mask 112.

Figure 1K:
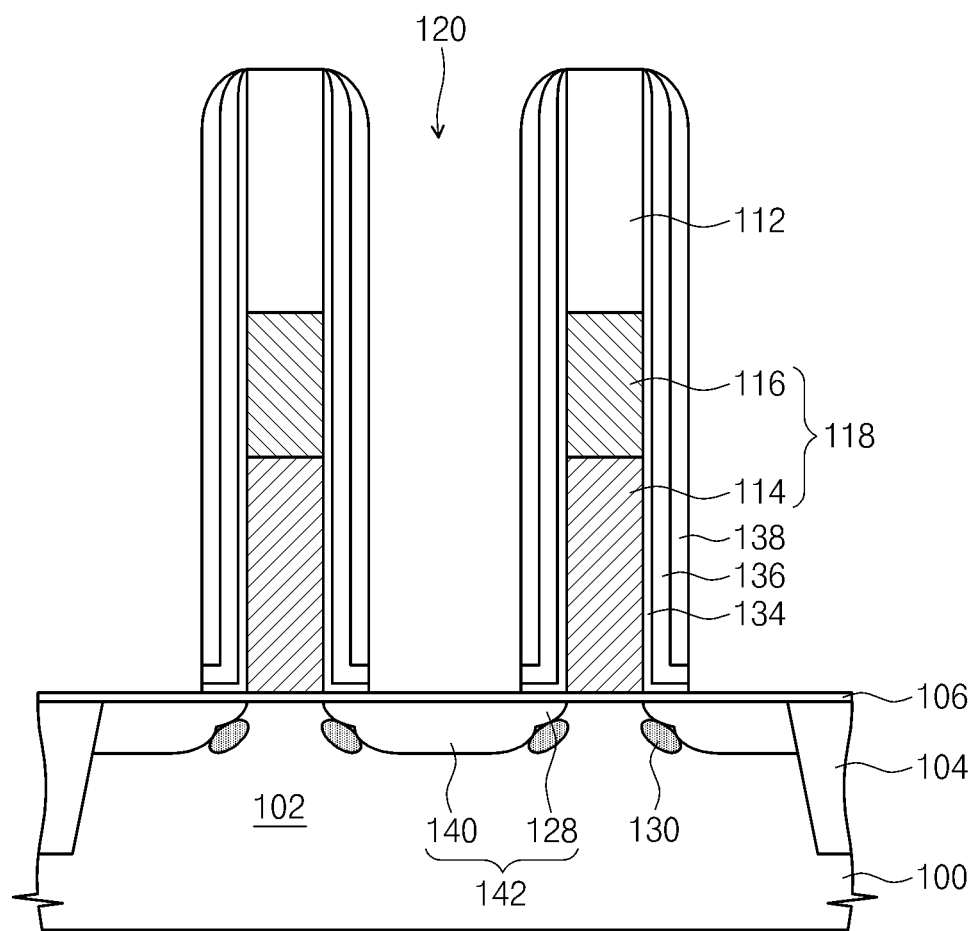

Referring to FIG. 1K, a second impurity region 140 may be formed on the substrate 100.

More specifically, (fifth) impurities of the second conductivity type are implanted into the substrate 100 so that the second impurity region 140 may be formed adjacent opposite sides of the second capping pattern 136, i.e., such that the boundary of the second impurity region 140 may be substantially vertically aligned with the outwardly facing sides of the second capping pattern 136. For example, in the case in which the substrate 100 may be originally doped with P-type impurities and the first impurity region 128 contains N-type impurities, the fifth impurities are N-type impurities. Furthermore, the fifth impurities are implanted to such a depth that the second impurity region 140 may be substantially deeper than the first impurity region 128. Also, the concentration of impurities at which the substrate is doped to form the second impurity region 140 may be substantially greater than the concentration of impurities at which the substrate was doped to from the first impurity region 128.

As a result, a source/drain region 142 including the first and second impurity regions 128 and 140 may be formed. In the above-described example in which the first impurity region 128 was formed using a substantially lower concentration of impurities than the second impurity region 140, the source/drain region 142 may be said to have a lightly doped drain (LDD) structure.

Accordingly, a transistor including the gate dielectric layer 106, the gate electrode 118, the mask 112, the first and second capping patterns 134 and 136, and the source/drain region 142 may be formed on the substrate 100.

Figure 1L:
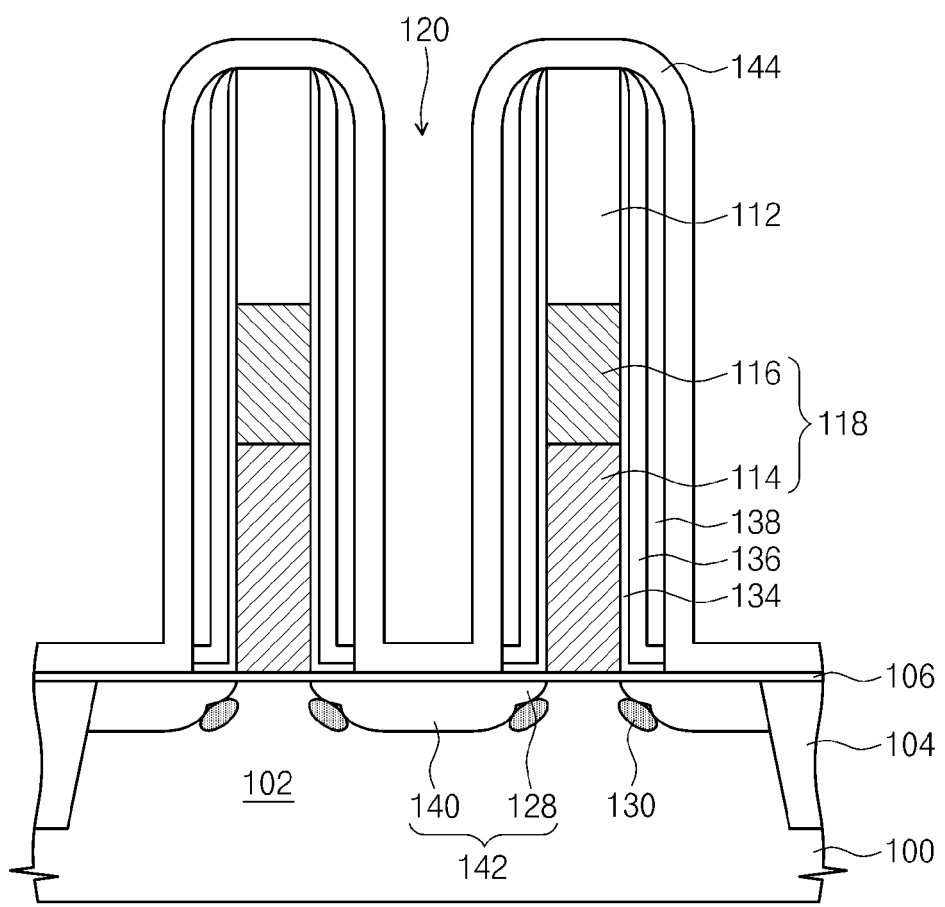

Referring to FIG. 1L, an etch-stop layer 144 may be conformally formed on the substrate 100, thereby covering the transistor. Thus, the etch-stop layer 144 does not fill what remains of the opening 120.

Figure 1M:
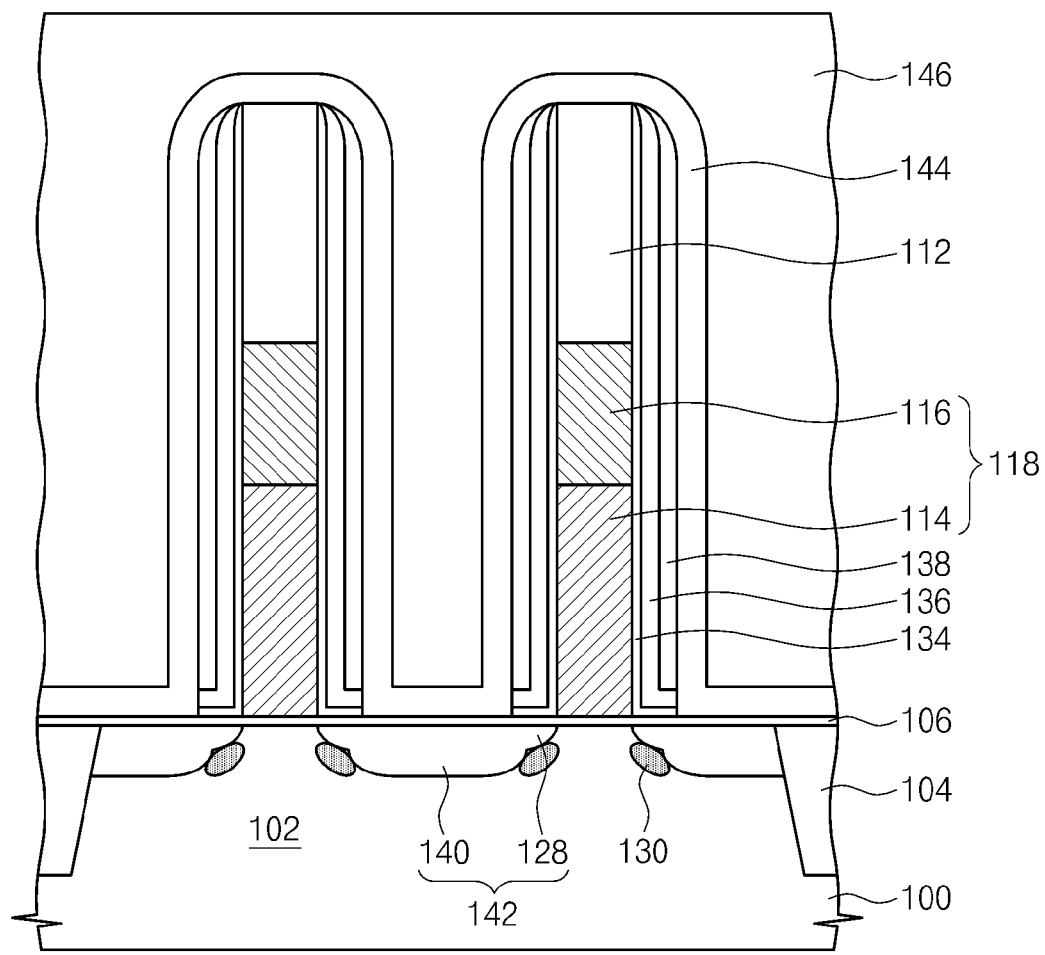

Referring to FIG. 1M, an interlayer dielectric 146 may be formed on the substrate 100 to such a thickness as to fill the opening 120.

The interlayer dielectric 146 may comprise an oxide such as silicon oxide, a nitride such as silicon nitride or an oxynitride such as silicon oxynitride. Examples of the silicon oxide include BSG, PSG, BPSG, and PE-TEOS as well as an HDP oxide.

A seam of void may be not formed in that portion of the interlayer dielectric 146 formed between the gate electrodes 118 because, as mentioned above, the opening 120 may be widened at its top by removing the etch byproduct 122 from on the mask.

Figure 1N:
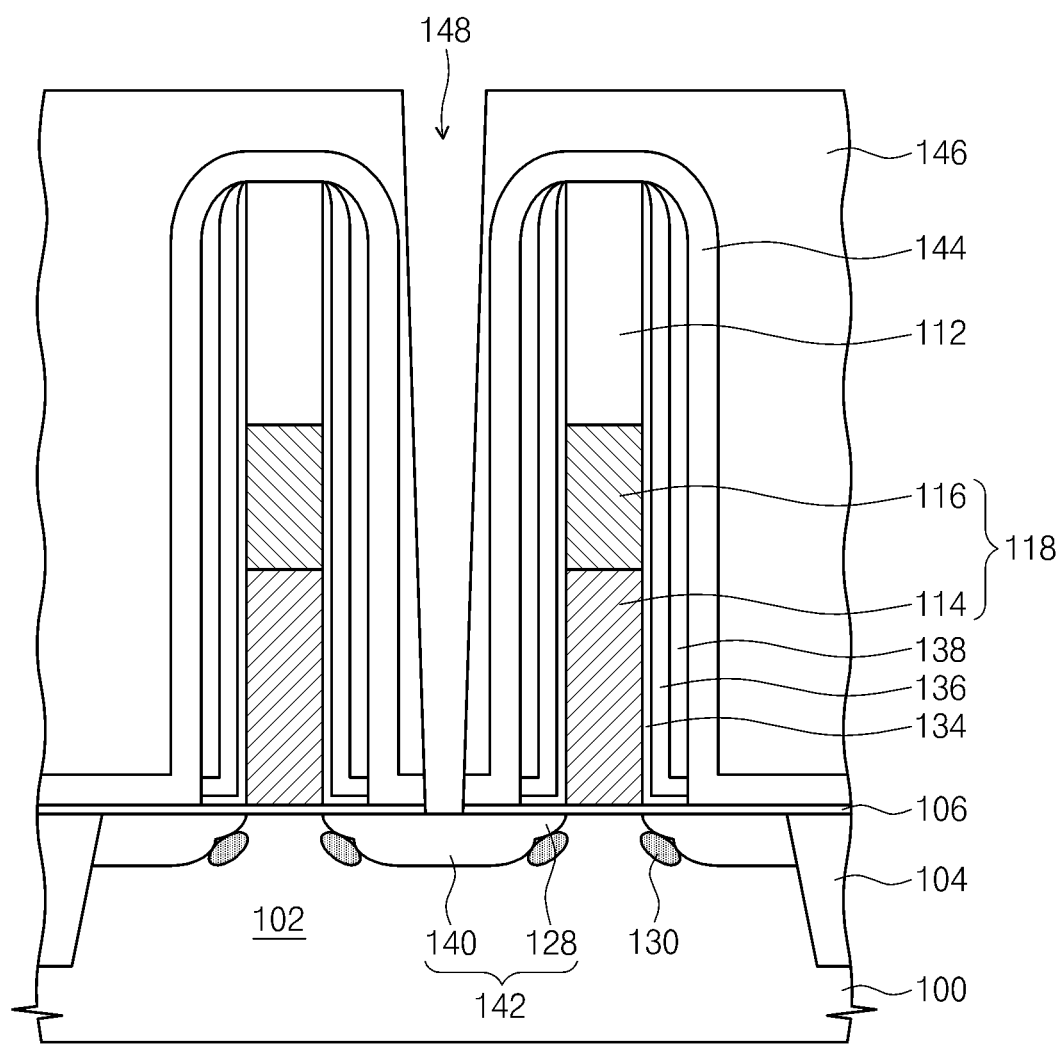
Figure 10:
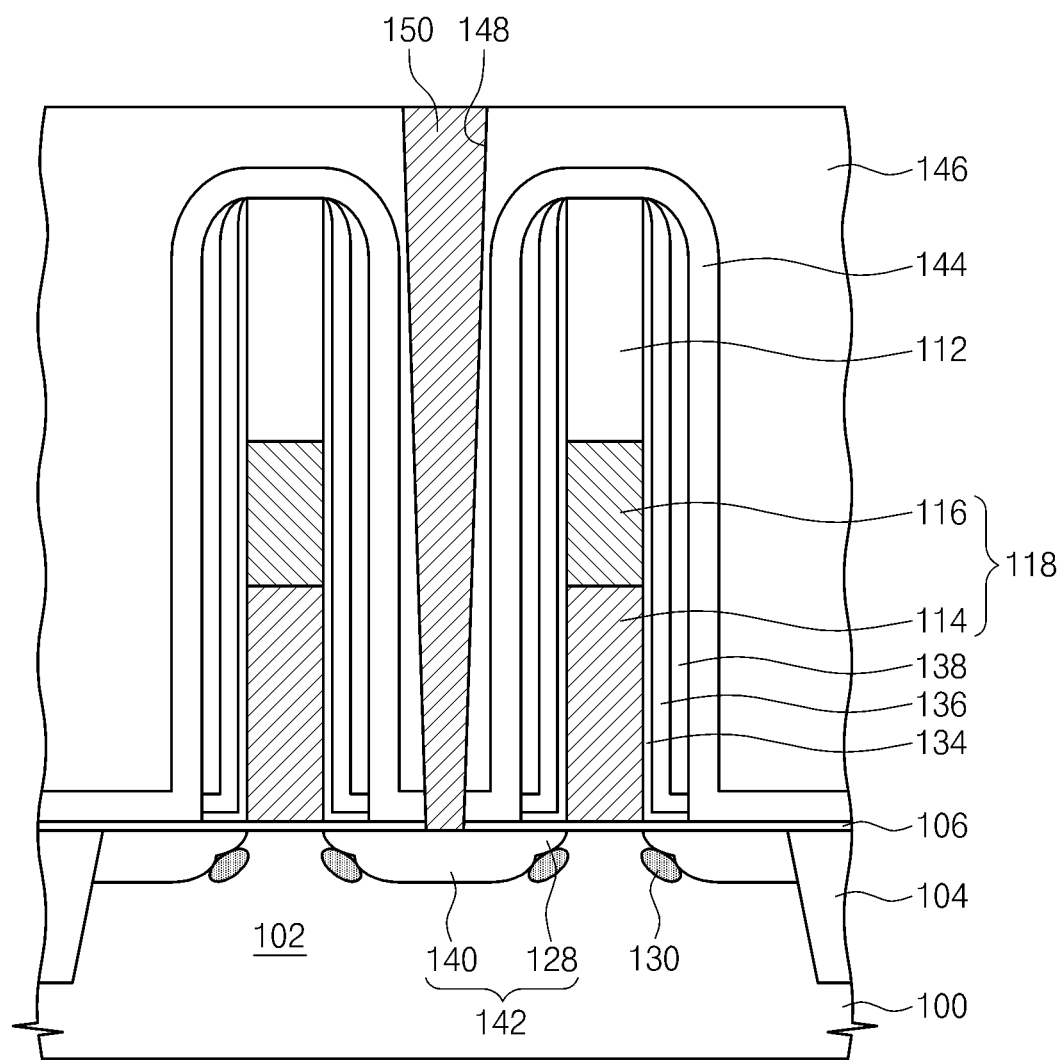

Referring to FIG. 1N, the interlayer dielectric 146 may be etched to form a contact hole 148 that exposes the source/drain region 142. More specifically, an etch mask may be formed on the interlayer dielectric 146. The interlayer dielectric layer 146 may be etched using the etch mask to form a contact hole 148. At this time, the etch-stop layer 144 serves to establish an endpoint for the etch process. Once the contact hole 148 may be formed, the etch mask may be removed.

Referring to FIG. 1O, the contact hole 148 may be filled to form a contact 150 electrically connected to the source/drain region 142. The contact 150 may also be electrically connected to a bit line or a capacitor formed in a subsequent process. The gate electrode 118 and the contact 150 are isolated from each other by the first and second capping patterns 134 and 136 to maximize a breakdown voltage between the gate electrode 118 and the contact 150 connected to the source/drain region 142. This will be described more fully later on with reference to Experimental Examples 3.

Experimental Examples 1

Figure 2A:
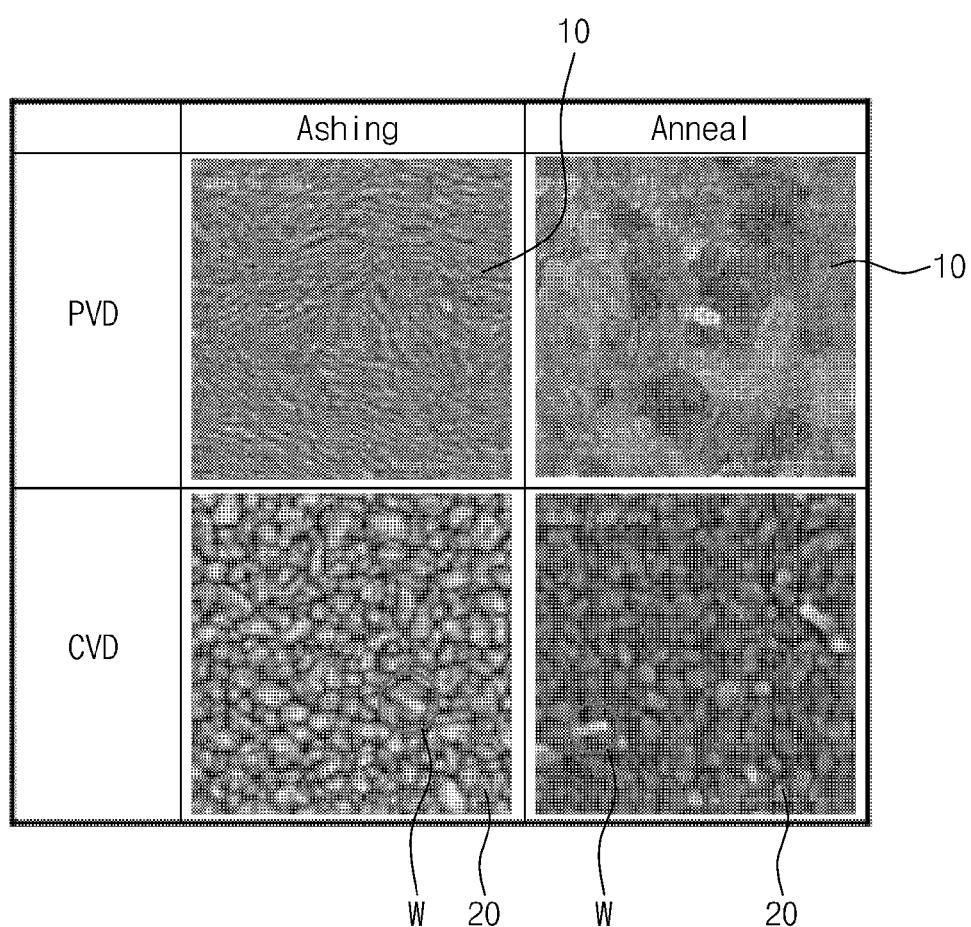
FIG. 2A is a table of photographs illustrating characteristics of a metal layer formed by PVD or CVD followed by ashing or annealing processes.

FIG. 2A illustrates characteristics of a metal layer after an ashing process or an annealing process.

More specifically, in FIG. 2A, reference numeral 10 designates first tungsten layers 10 formed by a PVD process and reference numeral 20 designates second tungsten layers 20 formed by a CVD process. The first tungsten layers 10 and the second tungsten layers 20 are subjected to an ashing process and an annealing process, respectively.

As shown in FIG. 2A, hardly any whisker growth is observable in the tungsten layer 10 formed by the PVD process and then subjected to the ashing process or the annealing process. On the other hand, whisker growth is observed in the tungsten layer 20 formed by the CVD process and then subjected to the ashing process or the annealing process. Such whisker growth may cause an electrical defect such as a short-circuit.

Thus, as FIG. 2A shows, a gate electrode including a metal layer formed by a PVD process has better electrical characteristics than that including a metal layer formed by a CVD process.

Experimental Examples 2

Figure 2B:
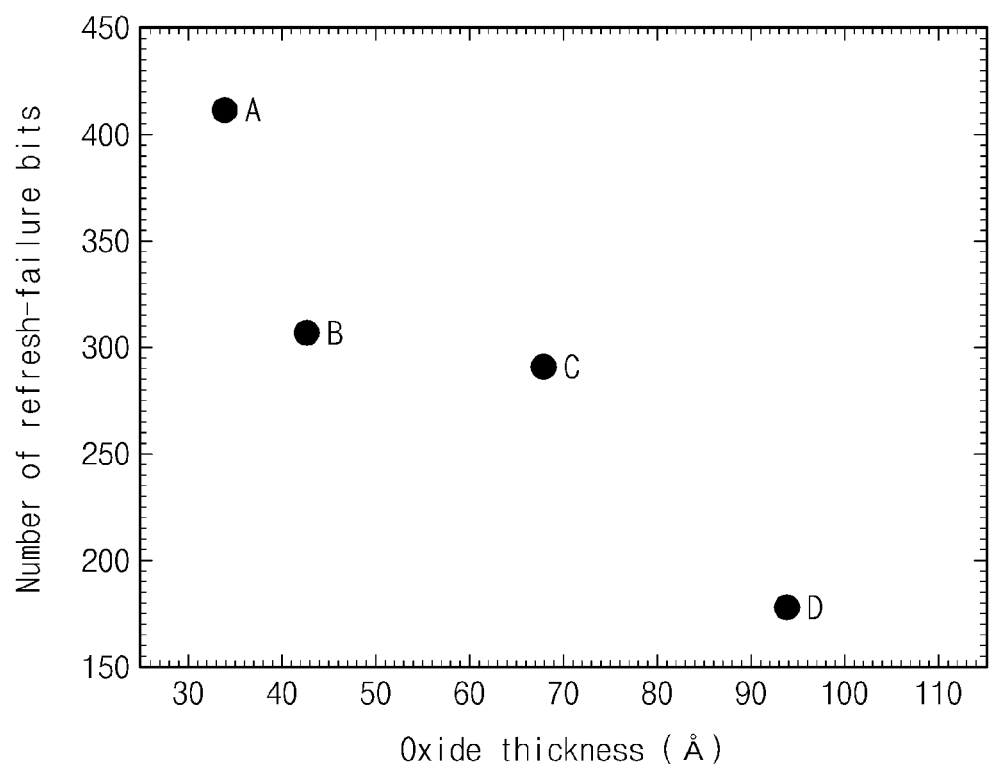
FIG. 2B is a graph showing a dependency of the number of refresh-failure bits on oxide thickness of a semiconductor device.

FIG. 2B is a graphic representation of the dependence of refresh-failure bits on oxide thickness of a semiconductor device, namely a dynamic random access memory (DRAM)

device each including a transistor ("A", "B", "C", or "D") and contact formed similarly to the method described with reference to FIGS. 1A to 1O, and a bit line, and a capacitor. The transistors "A", "B", "C", or "D" thus each include a gate dielectric layer 106, a gate electrode 118, a mask 112, first and second capping patterns 134 and 136, and a source/drain region 142.

The X-axis in FIG. 2B represents the physical thickness (in units of angstroms, A) of an oxide layer formed on the gate electrode 118 of a transistor of the DRAM and the Y-axis represents the number of refresh-failure bits of the DRAM. The physical thickness of the oxide layer includes the thickness of any byproduct 122 and the thickness of the first capping pattern 134.

In each of the transistors "A" and "B", the etch byproduct 122 was fully removed by an isotropic etch process performed for about 60 seconds. The first capping pattern 134 of the transistor "A" had a thickness of about 20 Å, and the first capping pattern 134 of the transistor "B" had thickness of about 40 Å. As shown in FIG. 2B, the number of refresh-failure bits of the transistor "A" was about 410, and the number of refresh-failure bits of the transistor "B" was about 300.

On the other hand, the transistors "C" and "D" each included a first capping pattern 134 and the etch byproduct 122. Specifically, the transistor "C" was isotropically etched for only about 30 seconds thereby leaving an etch byproduct having a thickness of 48 Å. Transistor "D" was isotropically etched for only about 15 seconds thereby leaving an etch byproduct having a thickness of about 74 Å. Furthermore, the first capping pattern 134 of each of the transistors "C" and "D" was formed to a thickness of about 20 Å. Referring again to FIG. 2B, the number of refresh-failure bits of the transistor "C" was about 280 and the number of refresh-failure bits of the transistor "D" was about 170.

FIG. 2B shows that the number of refresh-failure bits is inversely proportional to the thickness of the oxide layer.

More specifically, in the case in which the etch byproduct 122 is not present as in the transistors "A" and "B", the transistor having the thicker first capping pattern 134 (namely, transistor "B") has a substantially smaller number of refresh-failure bits. In the case in which the first capping patterns 134 have the same thicknesses but in which etch byproduct 122 is present as in the transistors "C" and "D", the transistor having the thicker etch byproduct (namely transistor "D") has a substantially smaller number of refresh-failure bits.

Experimental Examples 3

Figure 2C:
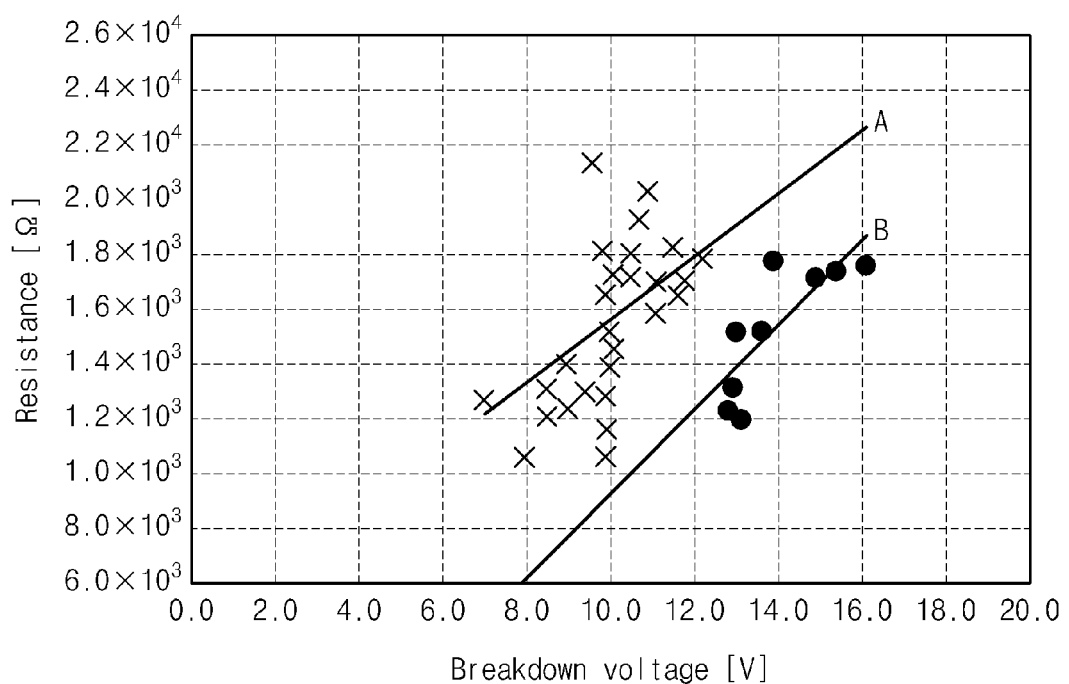
FIG. 2C is a graph of the relationship between breakdown voltage and contact resistance (resistance between a gate electrode and a contact).

FIG. 2C is a graphic representation of breakdown voltage between gate electrodes and contacts of DRAM devices. The X-axis represents contact resistance (in units of ohms, Ω) and the Y-axis represents breakdown voltage (in units of volts, V) between a gate electrode and a contact of a DRAM device. Note also, that the resistance values are those of 1000 contacts because it is not possible to measure resistance of just one contact. The measured values were linearized to obtain plot B of the graph.

In the graph of FIG. 2C, the DRAM devices whose breakdown voltages are indicated by plots A and B each included transistors and contacts fabricated similarly to the method described with reference to FIGS. 1A to 1O but in which the oxide capping pattern 134 was not provided. In each of the DRAM devices used to produce plot A, the etch byproduct 122 was completely removed. However, in each of the DRAM devices used to produce plot B, the isotropic etch process was performed for only about 15 seconds thereby leaving part of the etch byproduct 122 on the mask 112.

As shown in FIG. 2C, the DRAM devices used to produce plot B had a breakdown voltage of about 13.6 V and the DRAM devices used to produce plot A had a breakdown voltage of about 10.1 V when the resistance of the contacts 150 of the DRAMs was about $1.6 \times 10^3 \Omega$. Accordingly, it will be understood that breakdown voltage between the contact 150 and the gate electrode 118 is improved when more of the etch byproduct 122 is removed.

Experimental Examples 4

Figure 2D:
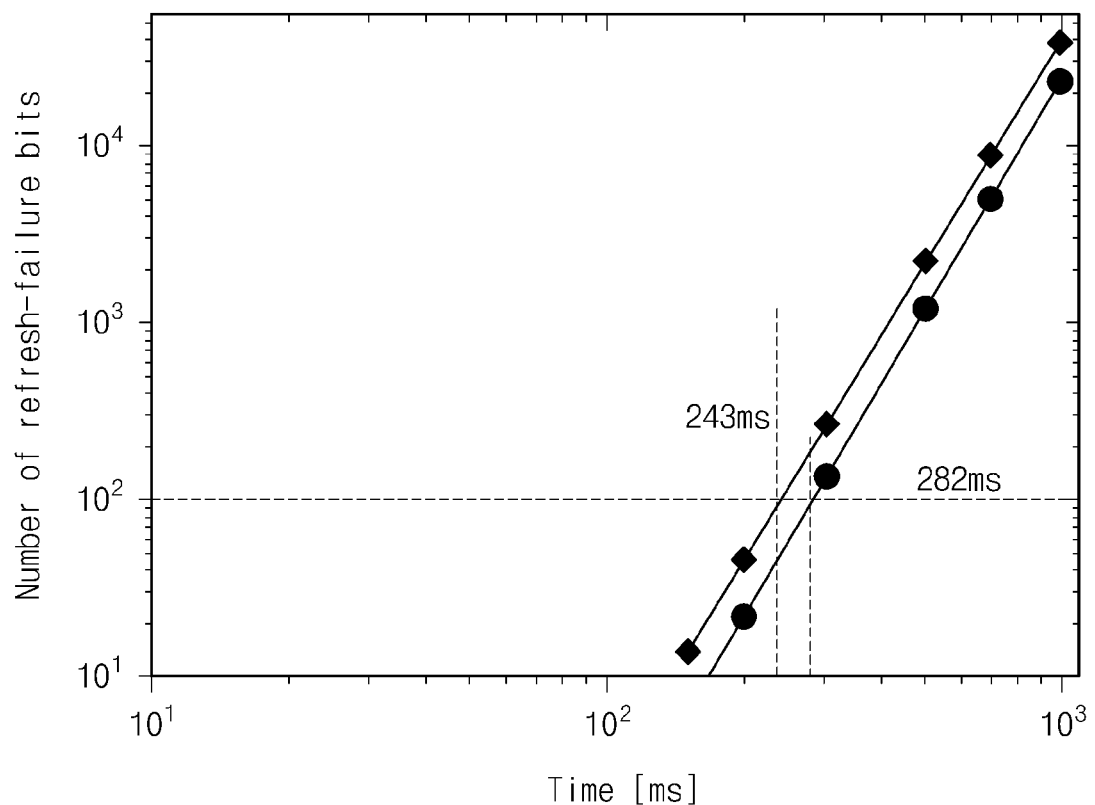
FIG. 2D is a graph of retention time for a semiconductor device which has an oxide-based capping pattern and for a semiconductor device which lacks such a pattern.

FIG. 2D is a graphic representation of the dependence between retention time and the presence of an oxide capping pattern in DRAM devices. The X-axis represents retention time (in units of milliseconds, ms) and the Y-axis represents the number of refresh-failure bits per 1 gigabyte DRAM. Retention time refers to the time from one refresh operation of the DRAM to the next.

In FIG. 2D, the symbols (-■-) indicate the results obtained from a transistor including a gate dielectric layer 106 formed by a rapid thermal oxidation process and the symbols (-●-) indicate results obtained from a transistor including a gate dielectric layer 106 formed by the rapid thermal oxidation process and a capping pattern 134 formed of an oxide by an ALD process. That is, the transistor used to obtain the results indicated by the symbols (-■-) did not include an oxide capping pattern 134.

As shown in FIG. 2D, retention time of a transistor having an oxide capping pattern 134 is about 282 ms for the case of 100 refresh-failure bit. In the same case but for a corresponding transistor which does not include a capping pattern 134, the retention time was about 243 ms. Accordingly, it will be understood that the capping pattern 134 serves to extend the retention time.

Experimental Example 5

Figure 2E:
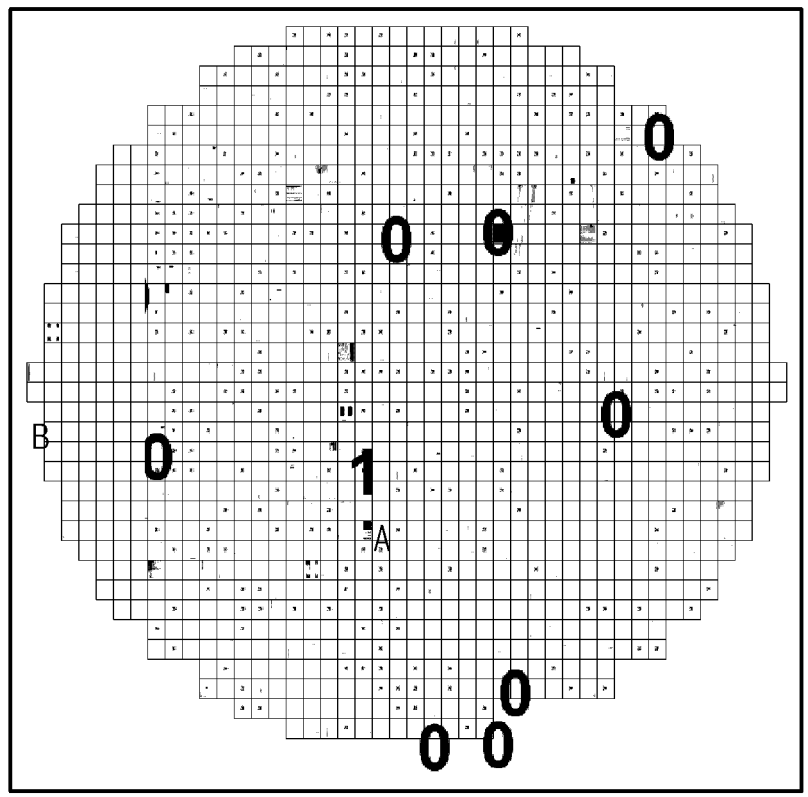
FIG. 2E is a map pointing out the presence of voids and seams in an interlayer dielectric fabricated according to the inventive concept.

FIG. 2E is a map of transistors completed up to the step shown in FIG. 1M according to the inventive concept, and indicating voids and seams in the interlayer dielectric 146. In the experimental example depicted by FIG. 2E, several spots across an array of the transistors were examined and the number of seams of voids found in the interlayer dielectric 146 at each of such spots is indicated.

As shown in FIG. 2E, one void or seam was found at a spot A and two voids or seams were found at a spot B. Substantially, no voids or seams were found at the other spots in the interlayer dielectric 146. Accordingly, it will be understood that the inventive concept, in which the etch byproduct is removed, minimizes the number of voids and seams that are otherwise likely to be produced in the interlayer dielectric 146.

From the results illustrated in and described with reference to FIGS. 2B to 2E, it will be understood that as the oxide layer surrounding the gate electrode increases, the number of refresh-failure bits decreases, the breakdown voltage is improved, and the retention time increases. However, a void or a seam may be formed in the interlayer dielectric 146 if the etch byproduct 122 remains on the mask 112.

Thus, in an embodiment of the inventive concept, the etch byproduct 122 is removed. However, to compensate for the reduction in thickness of the oxide surrounding the gate electrode 118, a capping pattern 134 comprising an oxide is formed by ALD. Thus, an oxide layer of superior quality is formed despite its minimal physical thickness. As a result, the semiconductor device according to the inventive concept retains excellent characteristics pertaining to its refresh operation, breakdown voltage, and retention time.

Moreover, the capping pattern 134 formed by the ALD process has better dielectric characteristics than a capping pattern formed by a thermal oxidation process or a CVD process.

Application Examples

Figure 3A:
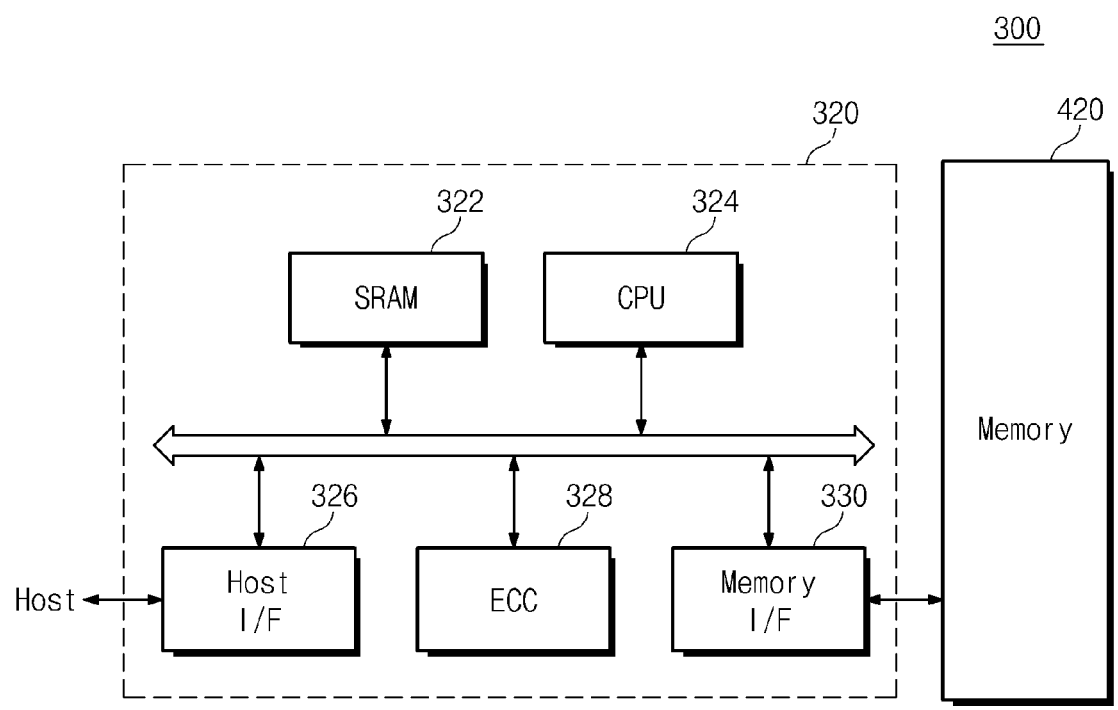
FIG. 3A is a block diagram of a memory card including a semiconductor device according to the inventive concept.

FIG. 3A illustrates an example of a memory card including an embodiment of a semiconductor device according to the inventive concept.

Referring to FIG. 3A, the memory card 300 includes a memory controller 320 that controls data exchange between a host and a memory 420 including a semiconductor device according to the inventive concept. In this example, an SRAM 321 is used as a working memory of a central processing unit (CPU) 324. A host interface 326 provides the data exchange protocol for a host to which the memory card 300 is to be connected. An error correction code circuit (ECC) 328 detects and corrects errors in data read from the memory 420. A memory interface 330 interfaces with the memory 420. The CPU 324 performs an overall control of the data exchange executed by the memory controller 320.

Figure 3B:
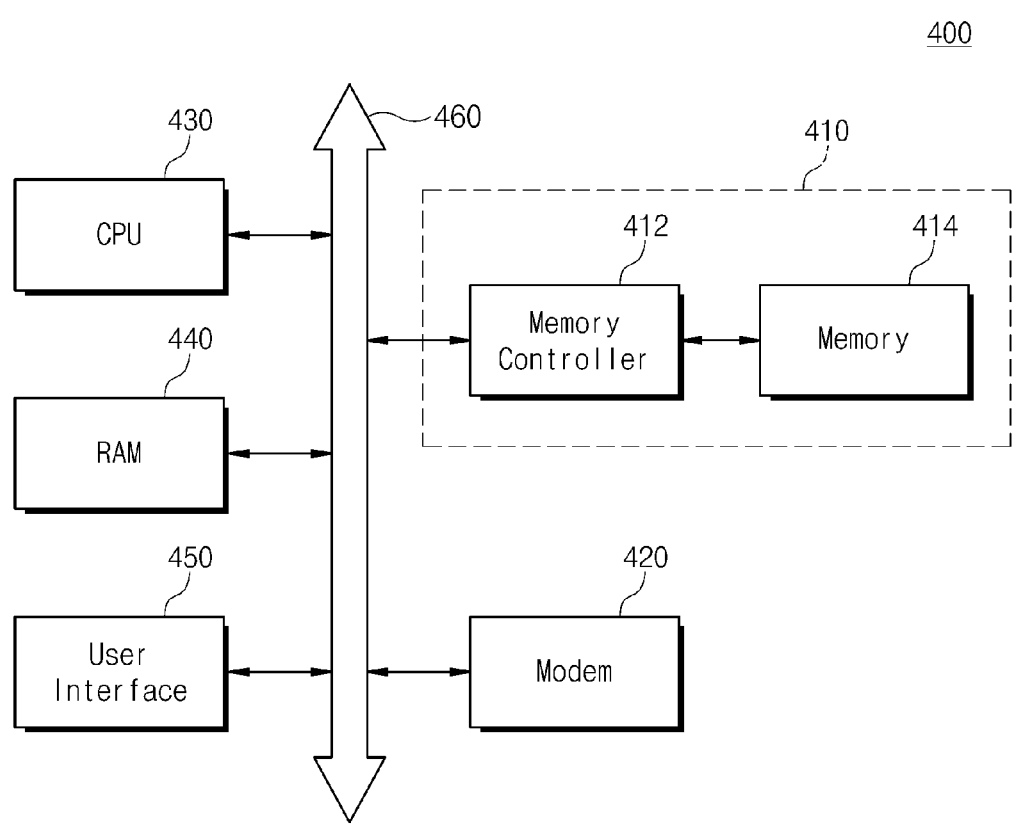
FIG. 3B is a block diagram of an information processing system employing semiconductor devices according to the inventive concept.

FIG. 3B illustrates an example of an information processing system 400 having a semiconductor device according to the inventive concept.

Referring to FIG. 3B, the information processing system 400 may constitute a mobile device, a computer or the like. The information processing system 400 includes a memory system 410 including a memory controller 412 and a memory 414 having a semiconductor device according to the inventive concept, a modem 420, a central processing unit (CPU) 430, a RAM 440, and a user interface 450 electrically connected to a system bus 460. Data processed by the CPU 430 or externally input data may be stored in the memory system 410. The memory system 410 may be embodied as a memory card and thus may have the same structure the memory card 300 described with reference to FIG. 3A. Alternatively, the memory system 410 may be embodied as a solid state disk (SSD), as a camera image sensor or as another type of chipset. In the case in which the memory system 410 constitutes a solid-state disk, the information processing system 400 can stably and reliably store high-capacity data in the memory 414.

According to an aspect of the inventive concept as described above, an etch byproduct remaining on a mask is removed to prevent a void or seam from being produced in an interlayer dielectric formed by a subsequent process. Furthermore, according to another aspect, the gate dielectric layer is hardly etched during the removal of the etch byproduct. Thus, a DRAM according to the inventive concept may have excellent refresh characteristics. In addition, the gate electrode is well insulated, i.e., the insulation has a high breakdown voltage.

Finally, embodiments of the inventive concept have been described above in detail. The inventive concept may, however, be embodied in many different forms and should not be construed as being limited to the embodiments described above. Rather, these embodiments were described so that this disclosure is thorough and complete, and fully conveys the inventive concept to those skilled in the art. Thus, the true spirit and scope of the inventive concept is not limited by the embodiments described above but by the following claims.

What is claimed is:

1. A method of fabricating a semiconductor device, comprising:
    forming a gate dielectric layer comprising an oxide, and at least one conductive layer on a substrate;
    forming a mask on the conductive layer;
    patterning the at least one conductive layer by etching the at least one conductive layer using the mask as an etch mask to thereby form a gate electrode,
    wherein a byproduct of the etching of the at least one conductive layer comprises an oxide and is formed on the mask, and
    the oxide of the gate dielectric layer and a material of the at least one conductive layer are selected such that the oxide constituting the byproduct has a higher etch rate with respect to an etchant than the oxide of the gate dielectric layer;
    using the etchant to remove the byproduct from the mask; and
    subsequently conformally forming at least one capping layer on the substrate that covers the gate electrode and the mask.

2. The method as set forth in claim 1, wherein the etchant comprises at least one of hydrofluoric acid (HF) and ammonium fluoride ($NH_4F$), whereby the etch byproduct is removed by the etchant without removing substantially any of the gate dielectric layer.

3. The method as set forth in claim 2, wherein the forming of at least one capping layer comprises forming first and second capping layers on the substrate; and further comprising:
    forming a first capping pattern on sidewall surfaces of the gate electrode and the mask by patterning the first capping layer;
    forming a second capping pattern on the first capping pattern by patterning the second capping layer; and
    forming a spacer on the second capping pattern by forming a spacer layer on the substrate after the first and second capping layers have been formed, and patterning the spacer layer.

4. The method as set forth in claim 3, wherein the forming of the first capping layer comprises forming an oxide on the gate dielectric layer, the gate electrode, and the mask by atomic layer deposition (ALD).

5. The method as set forth in claim 4, further comprising performing a selective oxidation process, after the first capping layer has been formed, to cure damage to the surface of the gate electrode.

6. The method as set forth in claim 4, wherein the forming of the second capping layer comprises forming a layer comprising a nitride by atomic layer deposition (ALD) on the first capping layer.

7. The method as set forth in claim 3, further comprising implanting impurities of a first conductivity type into the substrate, after the second capping layer has been formed but before the spacer layer has been formed, to thereby form a first impurity region whose boundary lies adjacent to opposite sides of the gate electrode.

8. The method as set forth in claim 7, further comprising implanting impurities of the first conductivity type into the substrate, after the spacer has been formed, to thereby form a second impurity region.

9. The method as set forth in claim 8, further comprising:
    implanting impurities of a second conductivity type, different from that of the first conductivity type, into the substrate at the side of the second impurity region to thereby form a halo region.

10. The method as set forth in claim 9, wherein the forming of the at least one conductive layer comprises:
- forming a first conductive layer comprising silicon on the gate dielectric layer; and
- forming a second conductive layer, comprising a metal or a metal compound, on the first conductive layer by a physical vapor deposition (PVD) process.

11. A method of fabricating a semiconductor device, comprising:
- forming a gate dielectric layer comprising an oxide on a substrate;
- forming a first conductive layer comprising silicon on the gate dielectric layer;
- forming a second conductive layer comprising a metal or a metal compound on the first conductive layer;
- forming a mask on the second conductive layer;
- performing an anisotropic etch process on the first and second conductive layers, using the mask as an etch mask, to thereby form spaced apart gate electrodes each having a segment of the mask thereon, and to thereby form a byproduct on the mask such that a projection is formed on an upper portion of the mask;
- performing an etch process formulated to remove the byproduct of the anisotropic etch process from the mask;
- conformally forming a capping layer on the substrate that covers the gate electrodes and the segments of the mask thereon;
- forming a source/drain region in the substrate adjacent opposite sides of the gate electrodes;
- subsequently depositing interlayer dielectric on the substrate to such a thickness as to fill openings between the gate electrodes; and
- forming a contact hole in the interlayer dielectric that exposes the source/drain region; and
- forming an electrically conductive contact plug in the contact hole.

12. The method as set forth in claim 11, wherein the second conductive layer is formed by a physical vapor deposition (PVD) process.

13. The method as set forth in claim 11, wherein the capping layer comprises and oxide, and further comprising patterning the capping layer to form a capping pattern, comprising an oxide on sidewall surfaces of each of the gate electrodes and sidewall surfaces of the segment of the mask thereon, before the interlayer dielectric is formed.

14. The method as set forth in claim 13, wherein the capping layer is formed by atomic layer deposition (ALD).

15. The method as set forth in claim 11, wherein the etch process uses an etchant comprising at least one of hydrofluoric acid (HF) and ammonium fluoride ($NH_4F$).

* * * * *